United States Patent [19]

Ahlstrom et al.

[11] Patent Number: 4,517,642
[45] Date of Patent: May 14, 1985

[54] DIGITAL COMPUTER SYSTEM HAVING UNIQUE MEANS OF REFERRING TO OPERANDS AND ABILITY TO EXECUTE A PLURALITY OF INTERNAL LANGUAGES

[75] Inventors: John K. Ahlstrom, Mountain View, Calif.; David H. Bernstein, Ashland, Mass.; Gerald F. Clancy, Saratoga, Calif.; Ronald H. Gruner; Craig J. Mundie, both of Cary, N.C.; Michael S. Richmond, Pittsboro, N.C.; Stephen I. Schleimer, Chapel Hill, N.C.; Steven J. Wallach, Saratoga, Calif.; Walter A. Wallach, Jr., Raleigh, N.C.

[73] Assignee: Data General Corporation, Westborough, Mass.

[21] Appl. No.: 266,521

[22] Filed: May 22, 1981

[51] Int. Cl.³ ............................................. G06F 9/40
[52] U.S. Cl. .................................................. 364/200
[58] Field of Search ... 364/200 MS File, 900 MS File, 364/300

[56] References Cited

U.S. PATENT DOCUMENTS

| | | | |
|---|---|---|---|
| 3,886,523 | 5/1975 | Ferguson et al. | 364/200 |
| 3,930,236 | 12/1975 | Ferguson et al. | 364/200 |
| 4,215,406 | 7/1980 | Gomola et al. | 364/200 |

Primary Examiner—Gareth D. Shaw
Assistant Examiner—Ronni S. Malamud
Attorney, Agent, or Firm—Gerald J. Cechony; Joel Wall

[57] ABSTRACT

A digital computer system in which data operands are represented by names. Each procedure includes a name table, and means are provided to employ the name table to resolve the names into storage addresses at run time. The system also has the ability to run any of a plurality of S-Languages (an S-Language being conceptually similar to a machine language but of higher order); each S-Language can be optimally tailored to a high-order user language. Each procedure includes a dialect code which indicates the dialect of S-Language to which the instructions in the current procedure belong, and the system has provision to execute each procedure accordingly.

9 Claims, 1 Drawing Figure

DIGITAL COMPUTER SYSTEM HAVING UNIQUE MEANS OF REFERRING TO OPERANDS AND ABILITY TO EXECUTE A PLURALITY OF INTERNAL LANGUAGES

CROSS REFERENCE TO RELATED APPLICATIONS

The present patent application is related to other patent applications assigned to the assignee of the present application.

BACKGROUND OF THE INVENTION

1. Field of the Invention

The present invention relates to a digital data processing system and, more particularly, to a multiprocess digital data processing system suitable for use in a data processing network and having a simplified, flexible user interface and flexible, multileveled internal mechanisms.

2. Description of Prior Art

A general trend in the development of data processing systems has been towards systems suitable for use in interconnected data processing networks. Another trend has been towards data processing systems wherein the internal structure of the system is flexible, protected from users, and effectively invisible to the user and wherein the user is presented with a flexible and simplified interface to the system.

Certain problems and shortcomings affecting the realization of such a data processing system have appeared repeatedly in the prior art and must be overcome to create a data processing system having the above attributes. These prior art problems and limitations include the following topics.

First, the data processing systems of the prior art have not provided a system wide addressing system suitable for use in common by a large number of data processing systems interconnected into a network. Addressing systems of the prior art have not provided sufficiently large address spaces and have not allowed information to be permanently and uniquely identified. Prior addressing systems have not made provisions for information to be located and identified as to type or format, and have not provided sufficient granularity. In addition, prior addressing systems have reflected the physical structure of particular data processing systems. That is, the addressing systems have been dependent upon whether a particular computer was, for example, an 8, 16, 32, 64 or 128 bit machine. Since prior data processing systems have incorporated addressing mechanisms wherein the actual physical structure of the processing system is apparent to the user, the operations a user could perform have been limited by the addressing mechanisms. In addition, prior processor systems have operated as fixed word length machines, further limiting user operations.

Prior data processing systems have not provided effective protection mechanisms preventing one user from effecting another user's data and programs without permission. Such protection mechanisms have not allowed unique, positive identification of users requesting access to information, or of information, nor have such mechanisms been sufficiently flexible in operation. In addition, access rights have pertained to the users rather than to the information, so that control of access rights has been difficult. Finally, prior art protection mechanisms have allowed the use of "Trojan Horse arguments". That is, users not having access rights to certain information have been able to gain access to that information through another user or procedure having such access rights.

Yet another problem of the prior art is that of providing a simple and flexible interface user interface to a data processing system. The character of user's interface to a data processing system is determined, in part, by the means by which a user refers to and identifies operands and procedures of the user's programs and by the instruction structure of the system. Operands and procedures are customarily referred to and identified by some form of logical address having points of reference, and validity, only within a user's program. These addresses must be translated into logical and physical addresses within a data processing system each time a program is executed, and must then be frequently retranslated or generated during execution of a program. In addition, a user must provide specific instructions as to data format and handling. As such reference to operands or procedures typically comprise a major portion of the instruction stream of the user's program and requires numerous machine translations and operations to implement. A user's interface to a conventional system is thereby complicated, and the speed of execution of programs reduced, because of the complexity of the program references to operands and procedures.

A data processing system's instruction structure includes both the instructions for controlling system operations and the means by which these instructions are executed. Conventional data processing systems are designed to efficiently execute instructions in one or two user languages, for example, FORTRAN or COBOL. Programs written in any other language are not efficiently executable. In addition, a user is often faced with difficult programming problems when using any high level language other than the particular one or two languages that a particular conventional system is designed to utilize.

Yet another problem in conventional data processing systems is that of protecting the system's internal mechanisms, for example, stack mechanisms and internal control mechanisms, from accidental or malicious interference by a user.

Finally, the internal structure and operation of prior art data processing systems have not been flexible, or adaptive, in structure and operation. That is, the internal structure structure and operation of prior systems have not allowed the systems to be easily modified or adapted to meet particular data processing requirements. Such modifications may include changes in internal memory capacity, such as the addition or deletion of special purpose subsystems, for example, floating point or array processors. In addition, such modifications have significantly effected the users interface with the system. Ideally, the actual physical structure and operation of the data processing system should not be apparent at the user interface.

The present invention provides data processing system improvements and features which solve the above-described problems and limitations.

SUMMARY OF THE INVENTION

The present invention relates to the structure and operation of a data processing system suitable for use in interconnected data processing networks, which internal structure is flexible, protected from users, effectively invisible to users, and provides a flexible and simplified interface to users. The data processing system provides an extremely large address space which is accessible to and common to all such data processing systems. The addressing mechanism provides addresses which are independent of the physical configuration of the system and allow information to be completely identified, with a single name, to the bit granular level without regard to information type and format. And, the present invention provides an instruction structure wherein high level user language instructions are transformed into dialect-coded, uniform, intermediate level instructions (S-Language instructions), where each dialect can be tailored to a particular high level user language. Another feature is the provision of an operand reference mechanism wherein operands are referred to in user's programs by names of uniform format which are transformed by an internal mechanism transparent to the user into storage addresses.

It is an object of the present invention to provide a data processing system capable of use in large, interconnected data processing networks.

It is yet another object of the present invention to provide an improved addressing mechanism suitable for use in large, interconnected data processing networks.

It is still another object of the present invention to provide a simplified and flexible user interface to a data processing system.

It is yet a further object of the present invention to provide an improved mechanism for referring to operands.

It is a still further object of the present invention to provide an instruction structure allowing efficient data processing system operation with a plurality of high level user languages.

Other objects, advantages and features of the present invention will be understood by those of ordinary skill in the art, after referring to the following detailed description of the preferred embodiments and drawings wherein:

Figure 270:
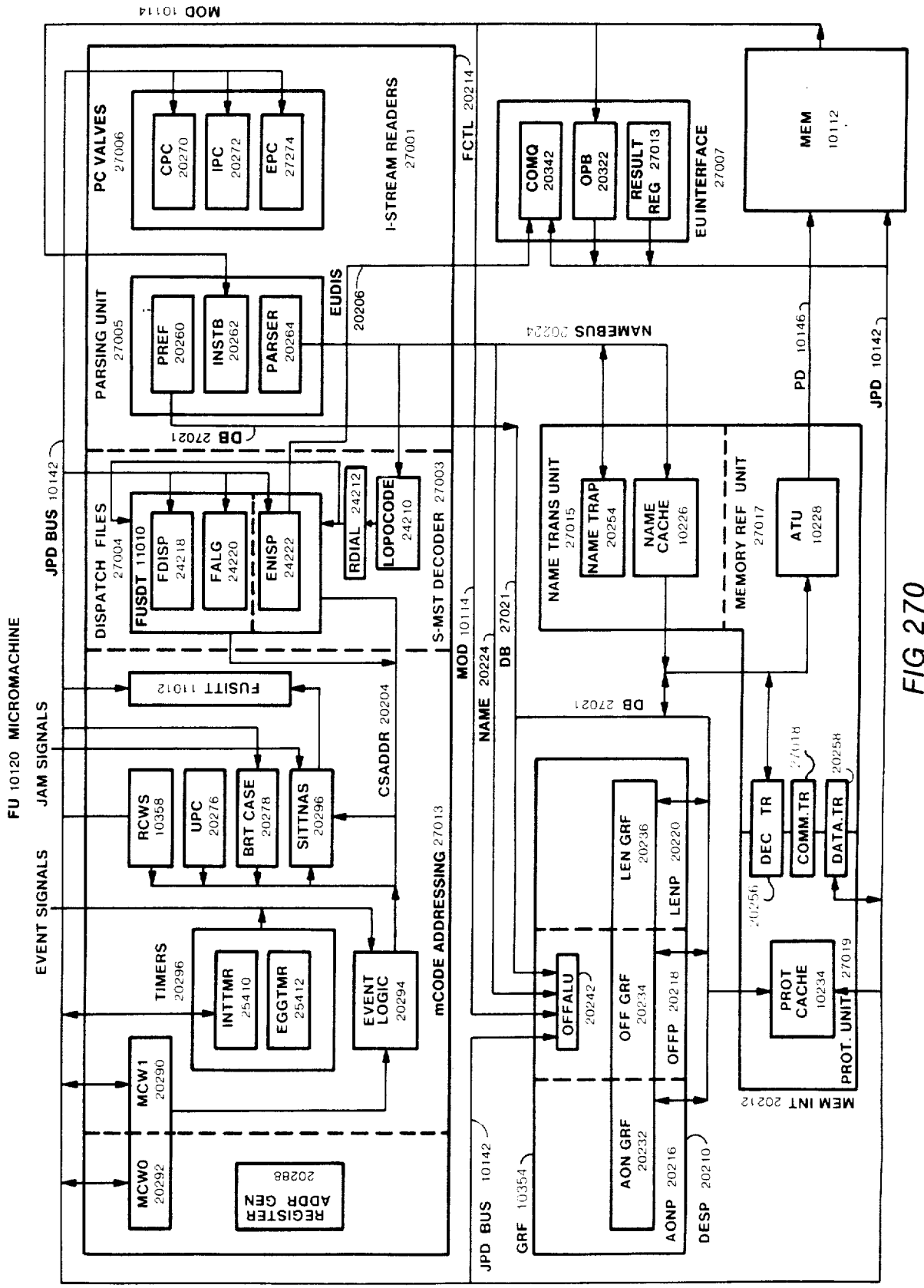
FIG. 270 is a detailed block diagram of a fetch unit micromachine of the present computer system.

This application incorporates by reference the entire application, Ser. No. 266,402, filed on May 22, 1981, of Ward Baxter II et al., now issued as U.S. Pat. No. 4,455,602, on June 19, 1984.

More particularly, attention is directed to FIGS. 106B, 106C, and 270 of the drawings in U.S. Pat. No. 4,455,602, and to that part of the specification, particularly at columns 301 et seq thereof, which relate to subject matter of the claims herein.

What is claimed is:

1. In a digital computer system (CS101) including:
    processor means (JP114) for performing operations upon operands,
    memory means (MEM 112) for storing said operands and procedures, said procedures including:
        S-Language instructions for controlling said operations; and,
        names referring to certain of said operands to be operated upon, and
    bus means (MOD 140, JPB 142) connected between the memory means and the processor means for conducting said instructions, names and operands between said memory means and said processor means;
    said processor means comprising:
        means for addressing said operands, including:
            name table means (10350) for storing name table entries, each of said name table entries corresponding to one of said names included in each one of said procedures and each of said name table entries comprising:
                first data from which may be determined an address of a location in said memory means of said operand referred to by one of said names, and
                second data identifying a format of said operand referred to by said one of said names; and,
            translation means (NAME TRANS UNIT 27015) connected to said bus means and responsive to said name table entries for providing outputs to said memory means representing said addresses in said memory means of said operands referred to by said names,
        ALU means (2034, 2074) for performing said operations,
        receiving means (INSTB 20262) connected to said bus means for receiving said instructions from said memory means, and
        microcode control means (10240, 27003, 27013) connected between said receiving means and said ALU means for providing sequences of microinstructions for controlling said ALU means, said sequences being selected from a plurality of sequences of microinstructions, one sequence corresponding to each of said instructions received by said receiving means.

2. The digital computer system of claim 1, wherein all of said names are of uniform length and format.

3. The digital computer system of claim 1, wherein:
    said each one of said procedures further includes a name table pointer (NTP 30311) representing a base location in said memory means, and
    said first data of said each one of said name table entries of each of said procedures contains information from which may be determined an address offset of a location in said memory means relative to said name table pointer of operand referred to by one of said names, and
    said translation means further comprises base register means (NTP within mCR 10366) connected to said bus means for receiving and storing said name table pointer of one of said procedures presently controlling said operations performed by said ALU means.

4. The digital computer system of claim 1, further comprising:
    name cache means (10226) connected to outputs of said translation means and having outputs to said memory means for storing said addresses,
    said name cache means connected to said receiving means and responsive to said names to provide name cache outputs to said memory means representing said addresses of certain said operands for which said name cache means has stored said addresses.

5. The digital computer system of claim 1, wherein:
    each of said S-Language instructions is a member of an S-Language dialect of a plurality of S-Language dialects,
    said receiving means further comprises dialect code means (RDIAL 24212) for storing a dialect code for specifying a particular dialect of which S-Language instructions received in the receiving means are members, said sequences of microinstructions include a set of sequences of microinstructions corresponding to each said S-Language dialect of said plurality of S-Language dialects, each set of sequences of microinstructions including at least one sequence of microinstructions corresponding to each said S-Language instruction in a said S-Language dialect, and said microcode control means is responsive to said dialect code and to each said S-Language instruction received in the receiving means to provide to said ALU means a sequence of microinstructions corresponding to each said S-Language instruction received in the receiving means.

6. The digital computer system of claim 2, wherein each of said procedures further includes a dialect code denoting a dialect of which the S-Language instructions of each procedure are members, and wherein said microcode control means further comprises:

control store means (SITT 11012) for storing said sequences of microinstructions for controlling said ALU means, and dispatch table means (SIDT 11010) for storing addresses corresponding to locations in said control store means of each said sequence of microinstructions, said dispatch table means responsive to said dialect code and to each said instruction to provide to said control store means each said address corresponding to said at least one microinstruction sequence corresponding to each said instruction, and said control store means responsive to each said address to provide to said ALU means said sequence of microinstructions corresponding to each said instruction.

7. The digital computer system of claims 1 or 5, said microcode control means further comprising:

writable control store means (11012) connected to said bus means for storing said sequences of microinstructions, and control store addressing means (SITTNAS 20286) responsive to said each one of said S-Language instructions and to operation of said processor means for generating control store read addresses and write addresses (CSADR 20204) corresponding to said S-Language instructions and to said operation of said processor means, said writable control store means responsive to said read addresses to provide said sequences of microinstructions to said ALU means and responsive to said write addresses to store said sequences of microinstructions.

8. The digital computer system of claim 6, said control store means comprising:

writable control store means connected from said bus means for storing said sequences of microinstructions, and said dispatch table means further comprising write address means responsive to operation of said processor means for generating write addresses, said writable control store means responsive to said write addresses for storing said sequences of microinstructions.

9. In a digital computer system including processor means for performing operations upon operands and memory means for storing procedures and said operands, said processor means and said memory means being connected by bus means, said procedures including:

instructions for controlling said operations; and, names referring to certain of said operands to be operated upon, said processor means comprising:

means for addressing said operands, including:

name table means for storing name table entries, each one of said name table entries corresponding to one of said names included in said procedures and said each one of said name table entries comprising data from which may be determined an address of a location in said memory means of one of said operands referred to by said one of said means to which said one of said name table entries corresponds, and means responsive to said names for translating each one of said name table entries so as to provide outputs to said memory means representing said locations in said memory means of said operands referred to by said names;

ALU means connected to said bus means for performing said operations, and microcode control means for providing sequences of microinstructions for controlling said ALU means, said sequences of microinstructions including at least one sequence of microinstructions corresponding to each of said instructions, said instructions being S-Language instructions having a uniform, fixed format, and said microcode control means responsive to each of said instructions for providing each sequence of microinstructions to said ALU means.

* * * * *